US005871872A

United States Patent [19]
Matijevic et al.

[11] Patent Number: 5,871,872
[45] Date of Patent: Feb. 16, 1999

[54] DYE INCORPORATED PIGMENTS AND PRODUCTS MADE FROM SAME

[75] Inventors: Egon Matijevic, Potsdam, N.Y.;
George J. Cernigliaro, Freeport, Me.;
Yie-Shein Her, Westford, Mass.; Daniel Y. Pai, Millbury, Mass.; Todd A. Richardson, Lowell, Mass.

[73] Assignee: Shipley Company, LL.C., Marlborough, Mass.

[21] Appl. No.: 866,580

[22] Filed: May 30, 1997

[51] Int. Cl.[6] .................................. C09C 1/28; G03F 7/00; G02B 5/20; G02F 1/1335
[52] U.S. Cl. ........................... 430/7; 430/270.1; 106/483; 106/490; 349/106
[58] Field of Search ........................... 430/7, 270.1, 292; 106/402, 483, 490; 349/106

[56] References Cited

U.S. PATENT DOCUMENTS

| | | |
|---|---|---|
| 4,241,042 | 12/1980 | Matijevic et al. . |
| 4,566,908 | 1/1986 | Nakatani et al. ............... 106/308 N |
| 4,675,251 | 6/1987 | Matijevic et al. . |
| 4,755,373 | 7/1988 | Gherardi et al. . |
| 5,015,452 | 5/1991 | Matijevic . |
| 5,127,952 | 7/1992 | Persello et al. ...................... 106/492 |
| 5,248,556 | 9/1993 | Matijevic et al. . |
| 5,318,628 | 6/1994 | Matijevic et al. . |
| 5,318,797 | 6/1994 | Matijevic et al. . |
| 5,344,489 | 9/1994 | Matijevic et al. . |

FOREIGN PATENT DOCUMENTS

| | | |
|---|---|---|
| 1-167368 | 7/1989 | Japan . |
| WO 92/21726 | 12/1992 | WIPO . |
| WO 94/21733 | 9/1994 | WIPO . |

OTHER PUBLICATIONS

Carotenuto, et al., "Preparation and Characterization of Nanocomposite Thin Films for Optical Devices", *Ind. Eng. Chem. Res.* 1996, 35, 2929–2932.

Charreyre, et al., "Adsorption of Rhodamine 6G onto Polystyrene Latex Particles with Sulfate Groups at the Surface", *Journal of Colloid and Interface Science*, 170, 374–382 (1995).

Fleming, "Adsorption with Aluminas in Systems with Competing Water", *Fundamentals of Adsorption*, Athanasios I. Liapis, Ed., Engineering Foundation, New York, pp. 221–234, 1987.

Giesche et al., "Well–Defined Pigments: I. Monodispersed Silica–Acid Dyes Systems", *Dyes and Pigments*, 17 (1991) 323–340.

Hsu et al., "Well–Defined Colloidal Pigments. II: Monodispersed Inorganic Spherical Particles Containing Organic Dyes", *Dyes and Pigments*, 19 (1992) 179–201.

Jan et al., "Adsorption of Metanil Yellow on a positively charge–modified nylon 66 membrane", *Colloid Surfaces*, 92, 1–7. 1994.

McKay et al., "Adsorption of Dyes on Chitin. I. Equilibrium Studies", *Journal of Applied Polymer Science*, vol. 27, 3043–3057 (1982).

Mishra, et al., "Sorption–Desorption Studies of Anionic Dyes on Alumina Pretreated with Acids", *Journal of Colloid and Interface Science*, vol. 129, No. 1, Apr. 1989, 41–52.

Tentorio et al., "Preparation and Optical Properties of Spherical Colloidal Aluminum Hydroxide Particles Containing a Dye", *Journal of Colloid and Interface Science*, vol. 77, 418–426, 1980.

Francoise et al., "New Water–Dispersible Silica–Based Pigments: Synthesis and Characterization", *Dyes and Pigments*, vol. 14, (1990), 101–112.

Jain et al., "Sorption–Desorption Studies of Anionic Dyes on Alumina Pretreated with Acids", *Colloids and Surfaces*, vol. 29, (1988) 373–389.

*Primary Examiner*—John A. McPherson
*Attorney, Agent, or Firm*—Robert L. Goldberg

[57] ABSTRACT

The adsorption of anionic dyes on nanosize alumina modified silica particles to form colored pigments is disclosed. The dyes are chemisorbed and their uptake is controlled by the strong chemical reaction between positive surface of the absorbent and negative charge of the adsorbates. The prepared pigments are useful in the formation of color films and their optical properties are described. Photoresists using nanosized pigments are also disclosed herein which are useful in making color filters for liquid crystal displays.

19 Claims, 12 Drawing Sheets

DYE INCORPORATED PIGMENTS AND PRODUCTS MADE FROM SAME

BACKGROUND OF THE INVENTION

This invention is directed to small size pigments of less than about 20 nm in average diameter which are formed of an anionic dye coating on alumina coated silica particles. The color pigments formed in this invention are useful in color films as well as in various applications such as color filters for liquid crystal displays in various other applications such as in ink jet color printing for color filter applications.

The interactions between dyes and solid surfaces may involve covalent bond formation or physical forces (electrostatic and/or van der Waals). For example, reactive dyes were grafted to the surface of derivatized silicas to prepare water-dispersible pigments for ink-jets (Winnik et al., *Dyes and Pigments*, 14, 101 (1990)). A number of studies (See: McKay et al., *J. Appl. Plym. Sci.*, 27, 3043 (1982); Fleming, H. L., "Fundamentals of Adsorption", pp. 221, Athanasios I. Liapis, Ed., Engineering Foundation, New York, 1987; Jain et al., *Colloid Surf.*, 29, 373 (1988); Mishara et al., *J. Colloid Interface Sci.*, 129, 41 (1984); Charreyre et al., *J. Colloid Interface Sci.*, 170, 374 (1995); Jan et al., *Colloid Surf.*, 92, 1 (1994)) dealt with the adsorption of dyes on charged solids, e.g. McKay et al., supra, investigated the adsorption of dyestuffs on chitin. Because of the porosity of the latter, it was difficult to establish the adsorption mechanism; over a limited dye concentration range, both Langmuir and Freundlich isotherms could fit the data. When alumina was used as adsorbent (See: Fleming, H. L., "Fundamentals of Adsorption", pp. 221, Athanasios I. Liapis, Ed., Engineering Foundation, New York, 1987; Jain et al., *Colloid Surf.*, 29, 373 (1988); Mishara et al., *J. Colloid Interface Sci.*, 129, 41 (1984)) the uptake of dyes was strongly dependent on the particle morphology, method of preparation, pretreatment of the solids and the equilibrium pH conditions. As a result of these issues, alumina particles are not considered practical for this application.

This invention discloses the formation of colored pigments by interacting several anionic dyes with alumina modified silica particles of different sizes and compositions. The advantage of this adsorbent is in its small size (<20 nm) and the positive charge of the surface due to the coating. The invention herein produces well-defined nanosize color pigments between about 4 nm to less than about 20 nm in average diameter. Previous studies (See: Giesche et al., *Dyes & Pigments*, 17, 323 (1991); Hsu et al., *Dyes & Pigments*, 19, 179 (1992); Carotenuto et al., *Ind. Eng. Chem. Res.* 35, 2929 (1996); Tentorio et al., *J. Colloid Interface Sci.*, 77, 418 (1980)) showed that adsorbing dyes on solid surfaces or incorporating them into inorganic particles can yield reproducible pigments of superior optical and mechanical properties.

Reference should also be had to the following U.S. Pat. Nos. 5,344,489, 5,318,797, 5,318,628, 5,248,556, 5,015,452, 4,755,373, 4,675,251 and 4,241,042 relating to pigments for further background information. Also background information relating to this field is to be found in WO 92/21726 published Dec. 12, 1992 and WO 94/21733 published Sep. 29, 1994.

This invention also is directed to color filters for a color liquid crystal display (LCD) and more particularly to imaging color filter resists such as negative tone color filter photoresists for both primary additive and secondary subtractive colors also utilizing nanosized colored pigments. It is also disclosed in this invention the use of top imaging positive or negative-tone photoresists prepared with nano-sized pigments, through which color pattern is delineated via aqueous alkaline development or solvent removal.

It is essential for color filter application that the pigment particles yield transparent filters of high contrast. In order to achieve these properties, it is necessary for pigment particles to be small, uniform in size, and fully dispersed in the polymer, in order to minimize light scattering effects, which would adversely affect the transparency. Furthermore, for the same reason above, refractive index of the core material was found to be necessary for the subject application. The small and uniform size of pigments produced herein are found to meet these requirements. The silica core size in the range of less than 20 nm colored with dyes will yield completely transparent filters in said polymers. The low refractive index contributes to the transparency of color filters and provides an unexpectedly high contrast.

In contrast, the pigments described in U.S. Pat. Nos. 5,318,628 and 5,344,489 are considerably larger particles, and as such, are not suitable for color filters or colored ink jet printing of colored filters.

In addition, particles of higher refractive index in these patents would also not be suitable for colored filters because of significant scattering effects which reduces transparency.

For background description of a color filter for an LCD and the method of producing the same reference should be had to U.S. Pat. No. 5,278,009.

BRIEF DESCRIPTION OF THIS DISCLOSURE

Figure 1:
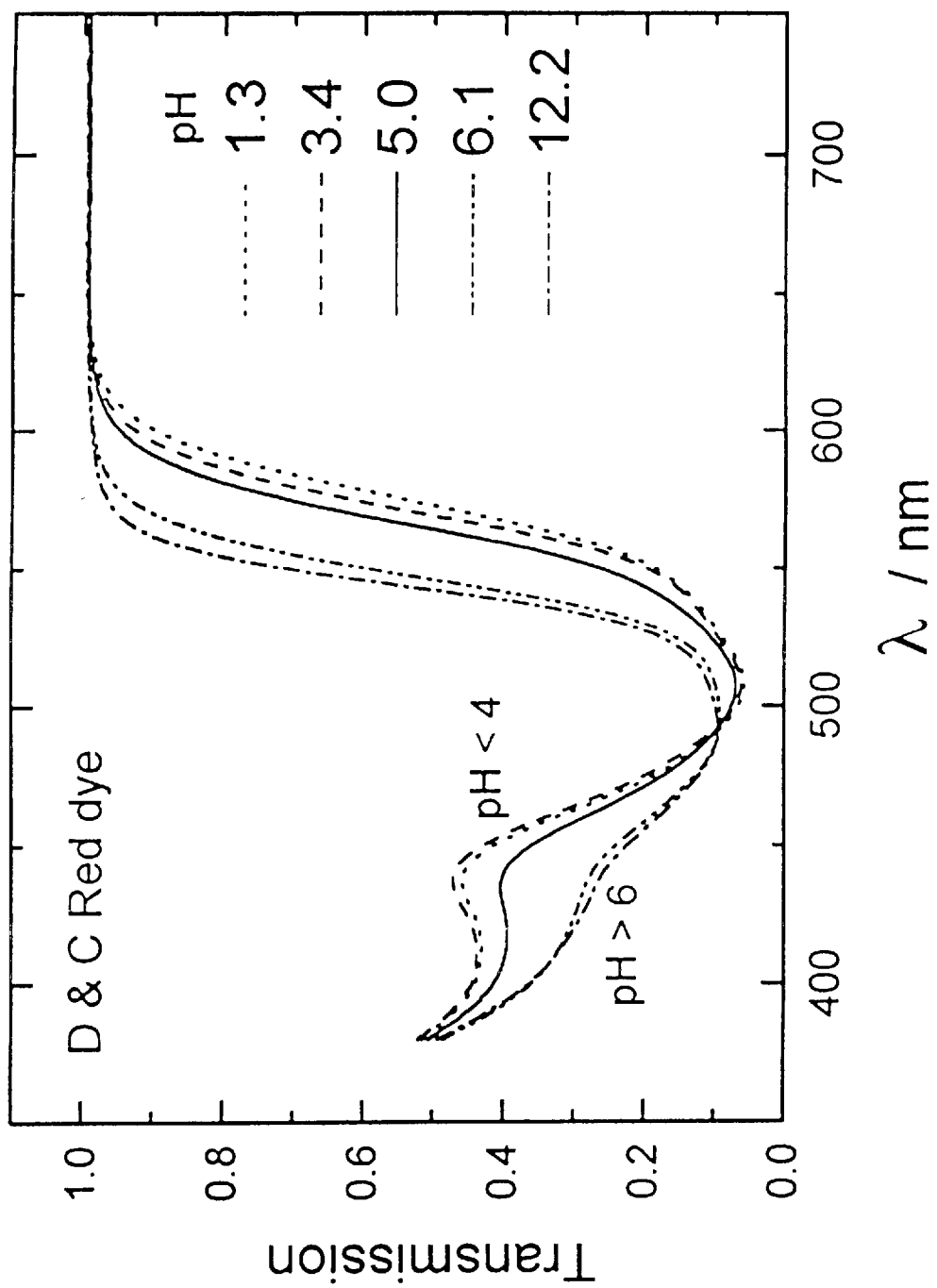
FIG. 1 discloses the UV-Visible spectra of D&C #6 Red dye solutions of different pH values. The dye concentration in all samples was $5.44 \times 10^{-5}$ mol.dm$^{-3}$.

This disclosure is directed to dyed nanosized substantially spherical colored pigments of silica having an adsorbant coating of alumina thereon to which there is adsorbed anionic dyes. The pigments are useful for forming various applications such as color films, resists, color filters and for a liquid crystal display and in ink jet printing of color filters.

The use of small, spherical alumina-silica particles as sorption sites for anionic dye structures provides certain advantages in their coated films. First, the use of dyed colorants prepared from said particles, provides for superior color contrast when compared to conventional pigment-dispersed color filters. Color contrast is the ratio of measured film luminance between matched polarizers aligned in parallel and crossed positions, respectively. Typically, conventional pigment dispersions give color contrast ratios in the range of 150–650, for red, green and blue filters. However, for red, green and blue color filter films prepared by the procedures of this invention, color contrasts range from 2000–3800. These high color contrast values are indicative of reduced light scatter, due to the small size of the dyed alumina-silica particles. The second advantage of this invention concerns the uniform shape of the small colloidal silica spheres. Light scattering simulation studies reveal that elliptically shaped particles of comparable volume and size distribution to spheres exhibit a marked increase in light scattering, due to the random orientation of their major axes with respect to incident light. Such problems are avoided with the substantially spherical nature of the dyed alumina-silica particles prepared by the procedures of this invention. Therefore, a primary improvement of this invention, due to the small, uniform particle shapes of the dyed aluminasilicon particles, is the marked improvement in color contrast for the red, green and blue films.

Another advantage of the described pigment systems of this invention is in the reproducibility of the color properties. It is well known that the color depends strongly on the particle size of the pigments, in addition to their refractive index. Thus, uniformity of particles assures consistency in the optical properties of pigments. An additional advantage of spherical particles is that their optical properties can be exactly calculated.

The pigments prepared by the method herein also bear charges (in addition to stabilizers), which makes it possible to disperse them without aggregation. In doing so, one minimizes the light scattering effects and provides for high transparency.

The colored pigments of this invention comprise silica particles preferably having a diameter less than about 20 nm and a surface area between 100 to 600 m$^2$/g and most preferably 200 m$^2$/g to 600 m$^2$/g, the particles coated with a layer of alumina to provide a positive charged surface and an anionic colored dye layer on said alumina coated silica. It is preferred that the dye includes a (—SO$_3$) and/or (—COO) groups when in solution for reaction with the≡AlOH$^+$ of the alumina surface when in solution. In this way, the dye is covalently bound to the surface of the alumina.

The silica particles used with or without the alumina coating are substantially spherical in nature.

The polymer resin binders used in the color filter resist formulations and other products disclosed herein should possess the following properties:
1. Aqueous base solubility
2. Compatibility with colorant pigments
3. Compatibility with photoimaging package used in resist formulation
4. Capability of forming an insoluble crosslinked network with photo-crosslinker system.

The preferred binders for the non-imaging composition are hydroxyl-containing materials such as acrylic polymers, polyesters, novolacs, and polyimides. For photoimaging compositions, resin binders having acidic groups, e.g. carboxylic acid groups, are particularly preferred. Suitable resin binders having acidic and hydroxyl group substitution include, e.g. acrylic polymer, vinyl polymers other than acrylic polymers, polyesters and polyimides. Acrylic polymers are generally preferred. These binders are suitably prepared by polymerization of one or more monomers or oligomers that comprise free acid groups, particularly unsaturated monomers that contain at least one free hydroxyl or carboxylic acid group. The preferred acrylic polymers can be prepared by the free radical polymerization of acrylic acid, methacrylic acid, the esters or amides thereof, and mixtures of such monomers in an organic solvent.

It is possible to modulate the polymer composition to obtain many polymers to satisfy the above requirement. For example, Methacrylic acid [MAA] and hydroxyethylmethacrylate [HEMA] in the polymer improves aqueous solubility and film crosslinking efficiency. Methyl methacrylate [MMA] can modulate glass transition temperature and hardness of the polymer. Butyl acrylate [BA] is known to provide heat resistance and adhesion properties for our application. Preferred acrylic polymers are those terpolymers comprising the above four monomers: MMA, HEMA, BA and MMA. Typical weight-% ranges for the four monomers in the tetrapolymers are MAA [5–25%], HEMA [3–30%], MMA [20–80%], and BA [1–50%]. Preferred weight-% ranges for the four monomers in tetrapolymer are MAA [10–15%], HEMA [5–15%], MMA [30–50%], and BA [5–20%].

The anionic dyes preferably used in this invention are those which have the reactive sulfonate and or carboxylic groups that can attach the dyes to the aluminum hydroxide sites on the surface of the coated silica particles.

It should be understood that while the dyes set forth in this application are preferred, it is to be understood that others can be used to provide the dyed incorporated pigments of this invention.

In this invention, it is preferred that a dispersant for the pigments be added with the preferred amount being in the preferred range of 0.1 to 3 wt/% of the total formulation, e.g., the resist or color filter formulation or other formulations therein. Table 4 discloses suitable dispersants. Overloading of dispersant limits lithographic performance and underloading promotes agglomeration of the pigments.

A liquid crystal display usually comprises two transparent substrates, such as indiumtin oxide coated glass substrates, provided with transparent electrodes and disposed with a gap of the order of 1 μm to 10 μm provided between the parts, and a liquid crystal material sealed in the gap, wherein the liquid crystal is orientated in a predetermined direction through an alignment layer by application of a voltage between the electrodes, thereby forming transparent and opaque portions, and thus displaying an image. In a color liquid crystal display, a color filter for three colors, i.e., red (R), green (G) and blue (B), corresponding to the three primary colors of light are provided over either of the transparent electrode substrates to effect additive color mixture of the three primary colors by the shutter action of the liquid crystal, thereby displaying a desired color.

Such a color filter for a color liquid crystal display comprises a transparent substrate, a colored layer, a protective film, and a transparent electrically conductive film, which are stacked in the mentioned order. The color filter is disposed to face another transparent substrate, which has electrodes or thin-film transistors formed in opposing relation to the colored pixels of the three primary colors, i.e., R, G and B, with a gap of several μm held therebetween, and a liquid crystal substance is sealed in the gap, thereby forming a liquid crystal display.

Figure 12:
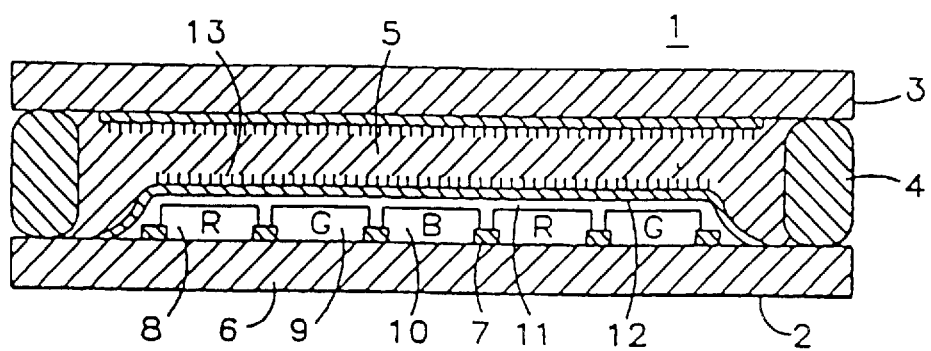
FIG. 12 is a sectional view of one example of a color liquid crystal display made with the dyed pigments of this invention in a resin binder to provide a solid color filter thereof.

In FIG. 12, a sectional view of one example of the color liquid crystal display. The color liquid crystal display 1 includes a color filter 2 and an opposing substrate 3 formed with thin-film transistors (TFT) or transparent electrodes. The color filter 2 and the substrate 3 are disposed to face each other across a predetermined gap and bonded together by using a sealing medium 4 formed by mixing reinforcing fibers with an epoxy resin material or the like. A liquid crystal 5 is sealed in the space defined between the color filter 2 and the TFT substrate 3.

The color filter 2 will be explained below more specifically. A substrate 6, for example, a glass substrate, has a black matrix 7 formed thereon so as to divide adjacent colored pixels (a material colored with a dye to form a colored pigment in a resin binder), thus forming a colored layer comprising colored pixels of the three primary colors, that is, red colored pixels 8, green colored pixels 9, and blue colored pixels 10, which are divided from each other by the black matrix 7. In addition, a protective film 11 is provided over the colored layer to protect it, and a transparent electrode film 12 for driving the liquid crystal is provided over the protective film 11. Further, an alignment layer 13 for aligning the liquid crystal is formed over the transparent electrode film 12. The pixels are formed from the pigment formulations of this invention such as disclosed in the Examples herein. The protective coating (top coat) may be formed from the materials disclosed in U.S. Pat. No. 5,563,011, the entire contents of which are incorporated herein by reference hereto. The procedures for making LCDs and color filters are disclosed in U.S. Pat. No. 5,278,009 which patent entire contents is incorporated herein by reference hereto. It should be realized that the color filter described in FIG. 12 is prepared from sequential coating, exposing and development of imaging red, green and blue color filter resists, using appropriate masking to fabricate the discrete color pixels as taught in the referenced patents.

Another application for the monodisperse colorants prepared by means of this invention is their use in fabricating color filters for reflective liquid crystal displays, either active matrix or super-twist nematic (STN). The need for high color filter transparency and contrast is all the more essential for this application, as a consequence of the doubling of color filter film path length due to back-surface light reflection. Conventional colorant pigments reduce transparency and contrast for this application, as a result of their low transparency and larger scattering effects.

PART A: EXAMPLES OF PIGMENT AND FILM PREPARATION

Example 1

Materials: The dyes used in this disclosure are listed in Table 1. The D&C Red#6 dye (Sun Chemical Co.) with purity of >95% was used as received, while Naphthol Yellow S (Aldrich, Acid Yellow #1, 75% pure) and Acid blue #25 (Aldrich, 45% pure) were recrystallized twice in water. The Guinea Green B (Aldrich, 50% pure) was used as received. To prepare saturated solutions, the dye powders were dissolved in hot water (~85° C.), and immediately filtered through 0.8 μm pore size membranes, then cooled to room temperature. After about one day, the solutions were filtered through 0.2 μm pore size membranes to remove any undissolved dye.

Ludox® CL particles supplied by DuPont of Wilmington, Del., were obtained by first producing nanosized silica and then coating it with alumina (See Ludox® colloidal Silica information published provided by DuPont Specialty Chemicals group). Ludox® CL is described by DuPont in the product information "as being colloidal silica in which each particle is coated with a layer of alumina. This converts the charge of the particle from negative to positive. The stabilizing counter-ion is chloride". The specifications for different samples used in this study are listed in Table 2. The specific surface areas were determined by the titration method disclosed in the text Iler, R. "*The Chemistry of Silica, Solubility, Polymerization, Colloid and Surface Properties, and Biochemistry*", John Wiley & Sons, Inc. (1979)) before coating with alumina. The number following CL is the equivalent particle diameter before coating with alumina calculated from the specific surface area, assuming that the spherical particles have smooth surfaces. The numbers in the parentheses give the Si/Al molar ratio. The solid content was determined by weighing the residue after the samples were dried overnight in a vacuum at 100° C.

Adsorption isotherms: A fixed amount (0.5 $cm^3$) of a Ludox CL sample was added into 9.5 $cm^3$ dye solutions of different concentrations. The samples were equilibrated for several hours in an ultrasonic bath and then separated by centrifugation at 10,000 rpm for 15 min. The dye concentration in the supernatant solution was determined spectrophotometrically. For some dyes the visible absorption spectrum was affected by the pH of the solution, as shown in FIG. 1 for the D&C Red #6. Since little change in absorption is observed over a wide pH range in basic solutions, the concentration of the dye in aqueous solutions was determined at pH ~7. The adsorbed amount of the dye was then calculated from the difference of the original concentration and that found in the solution after equilibration with silica.

Figure 3:
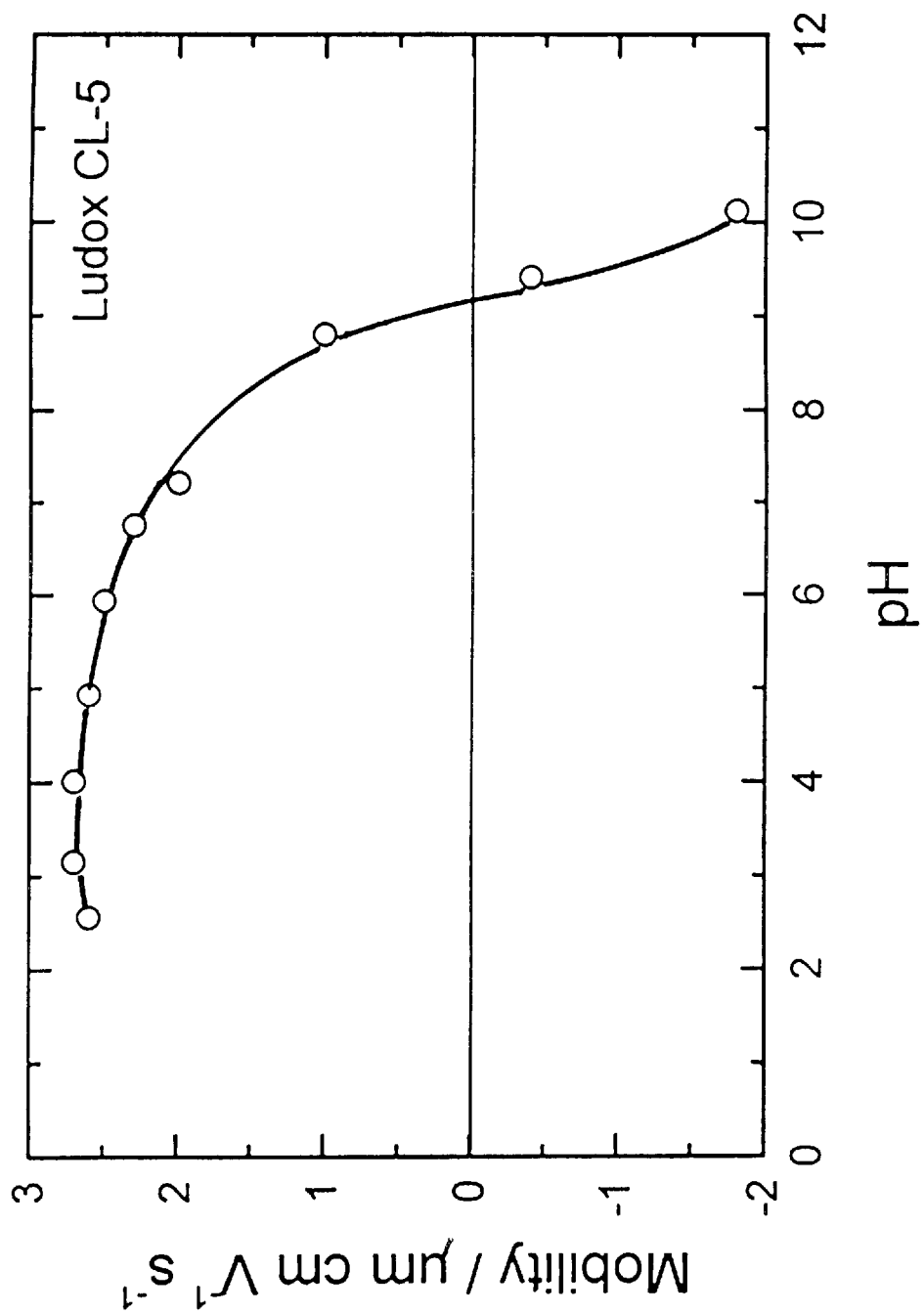
FIG. 3 shows the electrophoretic mobility as a function of the pH of Ludox CL-5 (3.5) (Table 2) sample at 25.0° C.

Characterization: The particle size was evaluated by scanning electron microscopy and/or dynamic light scattering. From the results obtained under the test conditions, it was found that the pigment remains in approximately the same nanometer size range. To determine the hydrodynamic radii of Ludox CL samples by dynamic light scattering, all samples were diluted with water to ~1.2 wt% concentration to minimize any interparticle interaction, and the pH was adjusted to ~4.0. The data were analyzed by the CONTIN program (See Provench, S.W. *Comput. Phys. Commun.*, 27, 215 (1982)) to obtain the size distribution. FIG. 3 shows a typical size distribution curve for Ludox CL-5 (3.5) in terms of relative weight percentages, assuming that the particles behave as hard sphere. The obtained hydrodynamic radii, $R_h$, are listed in Table 2.

The electrophoretic mobility was measured with a DELSA 440 (Coulter Electronics) instrument. The data for Ludox CL-5 (3.5) in aqueous solution containing 1.2 wt % solids, as a function of the pH, yield the isoelectric points (i.e.p) ~9.2 (FIG. 3). Since the i.e.p. of silica and alumina are very different, i.e. at pH ~2.0 and 9.3, respectively (See Parks, et al. *J. Phys. Chem.*, 66, 967 (1962); Brace, et al., *J. Inorg. Nucl. Chem.*, 35, 3691 (1973) it can be assumed that the surface of these particles consists of pure alumina. The mobility of other Ludox CL samples at pH ~4.0 is the same within the experimental error (±10%) (Table 2), indicating essentially identical nature of particle surfaces of all samples.

Thermogravimetric analysis (TGA) was carried out over the temperature range of 30°–1000° C. at a scan rate of 25° C./min in air. Based on the obtained curves for Ludox samples and pigments, the weight loss below 350° C. was attributed to the evaporation of the solvent used in the preparation of the pigment.

Pigment and thin film preparation: The well-defined nano-sized pigments were prepared by adding dropwise modified silica into a concentrated dye solution (~0.02 mol dm$^{-3}$) under stirring at room temperature. The precipitate (pigment) was separated by centrifugation and washed twice with distilled water to remove physically adsorbed and/or trapped dye. In order to have a common solvent (propylene glycol methyl ether acetate, PMA) with the dispersing medium (polymer), the pigment slurry was washed several times each with ethanol and then PMA. The so obtained pigment slurry was dispersed into acrylic copolymer solution (resin binder composition) under stirring and/or ultra-sonication. The thin film was prepared by spincoating the pigment-polymer dispersion on a glass substrate under controlled speed. The thin film was baked at 80° C. for five minutes to remove the solvent. The acrylic copolymer used may be that shown in U.S. Pat. No. 5,563,011. Preferably the copolymer used is of the following composition: 5 mole-% methylacrylic acid (MAA), 10 mole-% glycidyl methacrylate (GMA), 20 mole-% butyl acrylate (BA) and 65 mole-% methyl methacrylate (MMA).

Results

Figure 4:
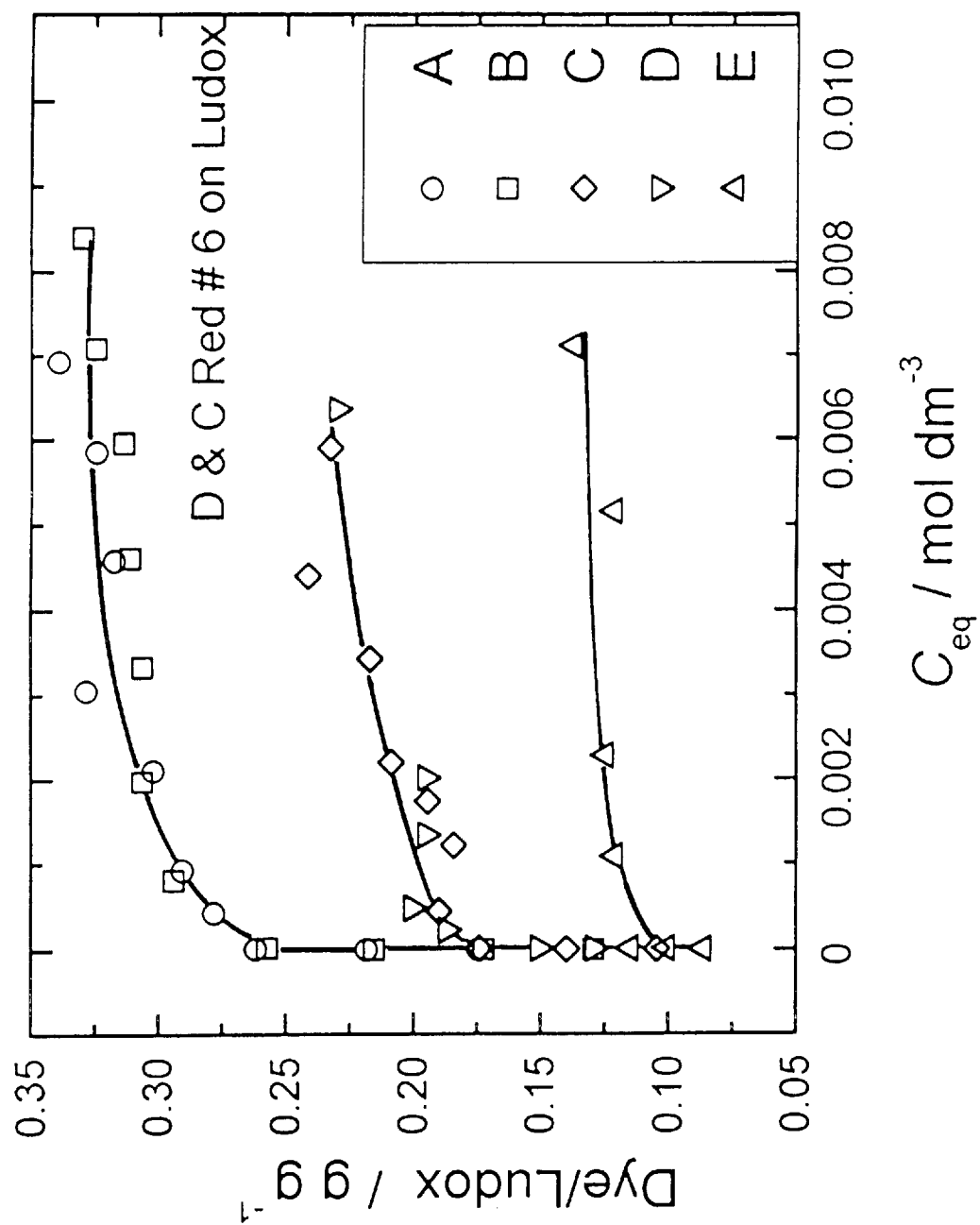
FIG. 4 shows the adsorption isotherms of the D&C Red #6 dye for five different Ludox CL samples (Table 2) at room temperature.
Figure 5:
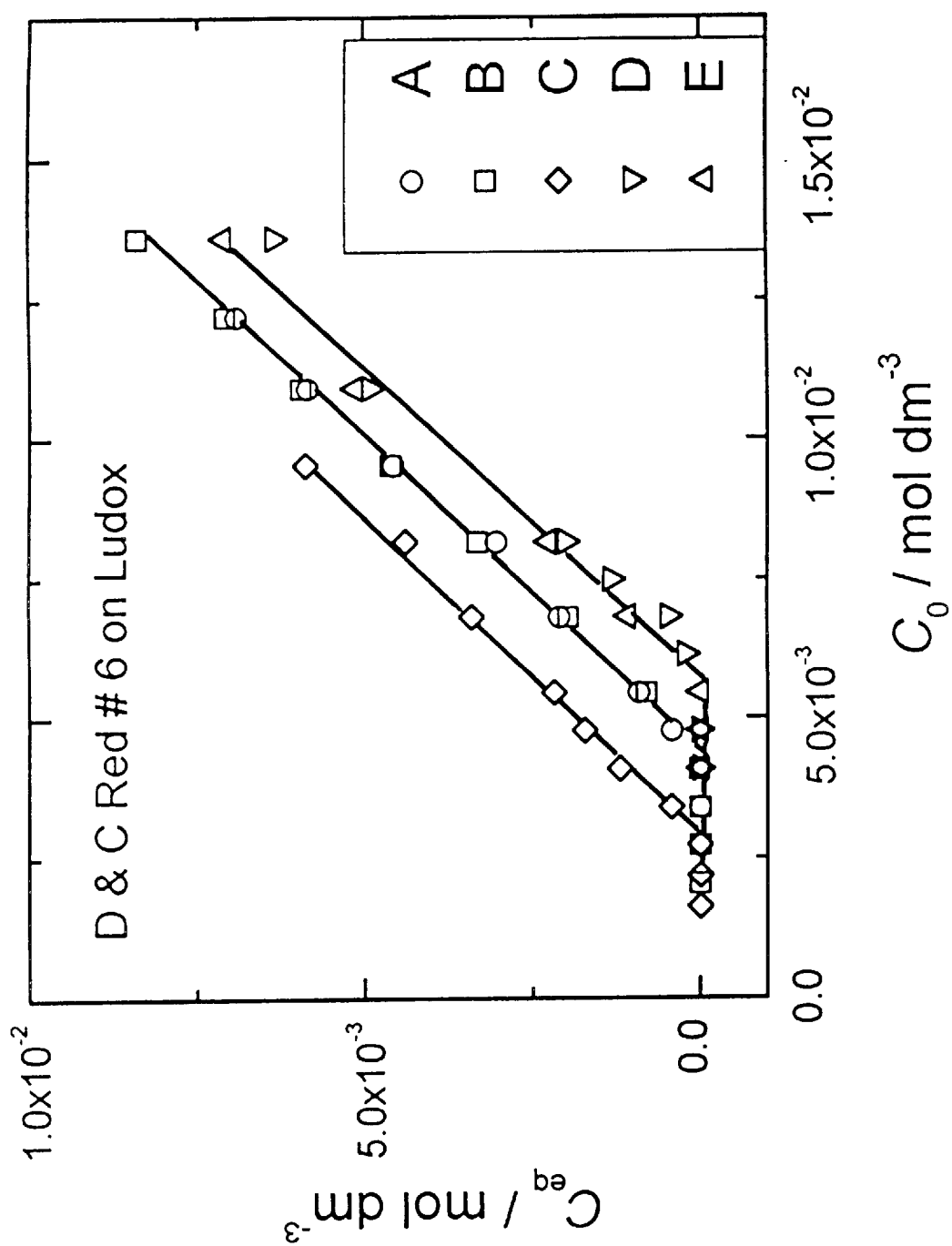
FIG. 5 discloses the equilibrium concentration of D&C Red #6 dye ($C_{eg}$) as a function of its initial concentration ($C_o$) for adsorbents listed in Table 2.

Effect of the adsorbent: The effect of the adsorbent on the uptake of dyes is shown by using Ludox CL samples of different sizes and compositions and the D&C Red #6. FIG. 4 shows that all adsorption isotherms are of the Langmuir type, since the electrokinetic behavior of these adsorbents indicated the same surface composition. The saturation adsorption per unit weight (Table 2) decreases with increasing particle size of different adsorbents, due to the smaller specific surface areas. The equilibrium concentrations of the dye ($C_{eq}$) is close to zero at its low initial concentrations ($C_o$) and then increases linearly above a critical value $C_o^*$ (FIG. 5), which is characteristic of solutes that are chemisorbed. Indeed, the supernatant solutions are essentially colorless below $C_o^*$, indicating that essentially the entire content of the dye is adsorbed by Ludox CL particles. The critical value decreases with increasing particle size when the same amount of adsorbents is used.

Figure 6:
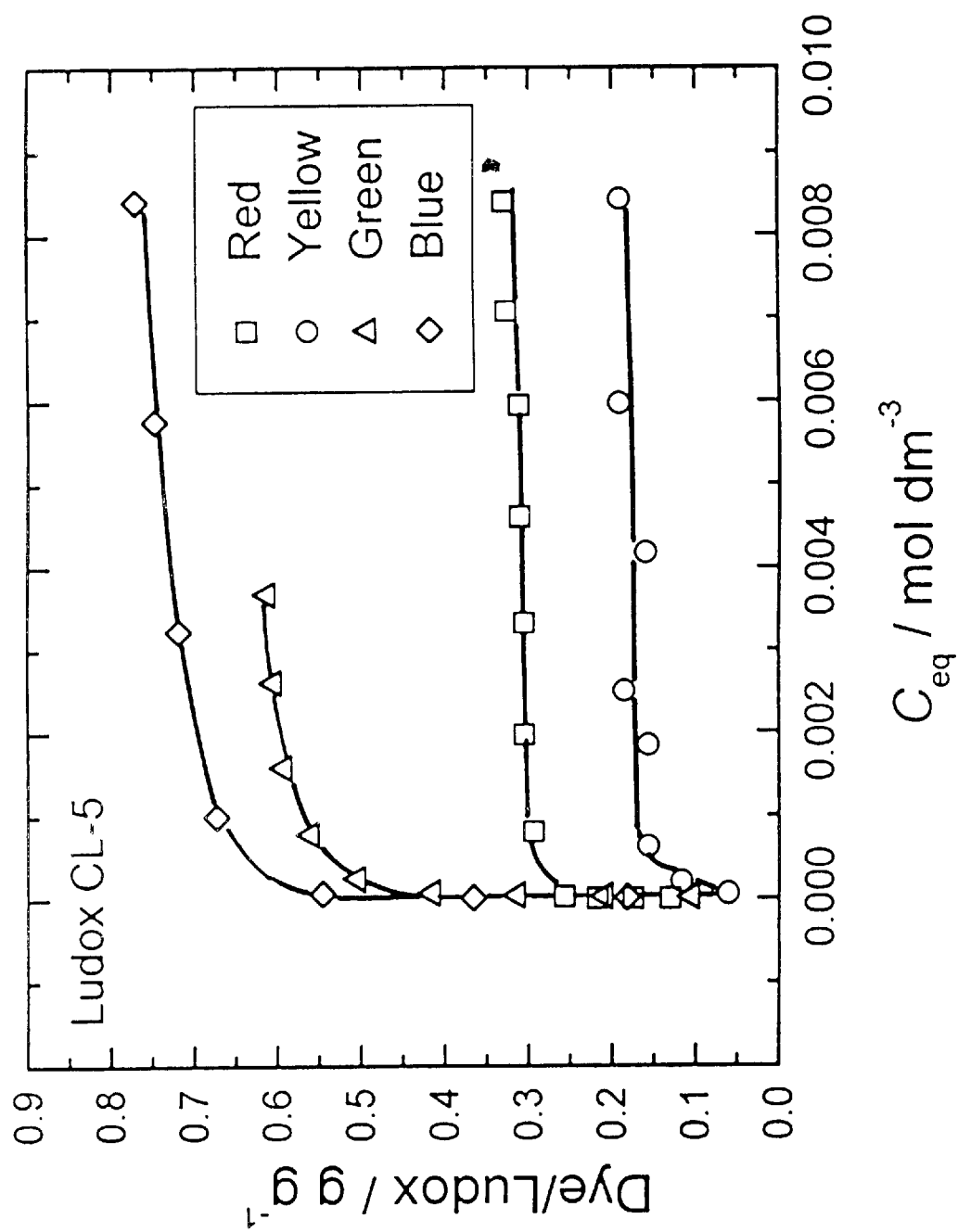
FIG. 6 discloses the adsorption isotherms of D&C Red #6; Acid Yellow #1; Acid Blue 25; and Guinea Green B, on Ludox CL-5(3.5) at room temperature.
Figure 7:
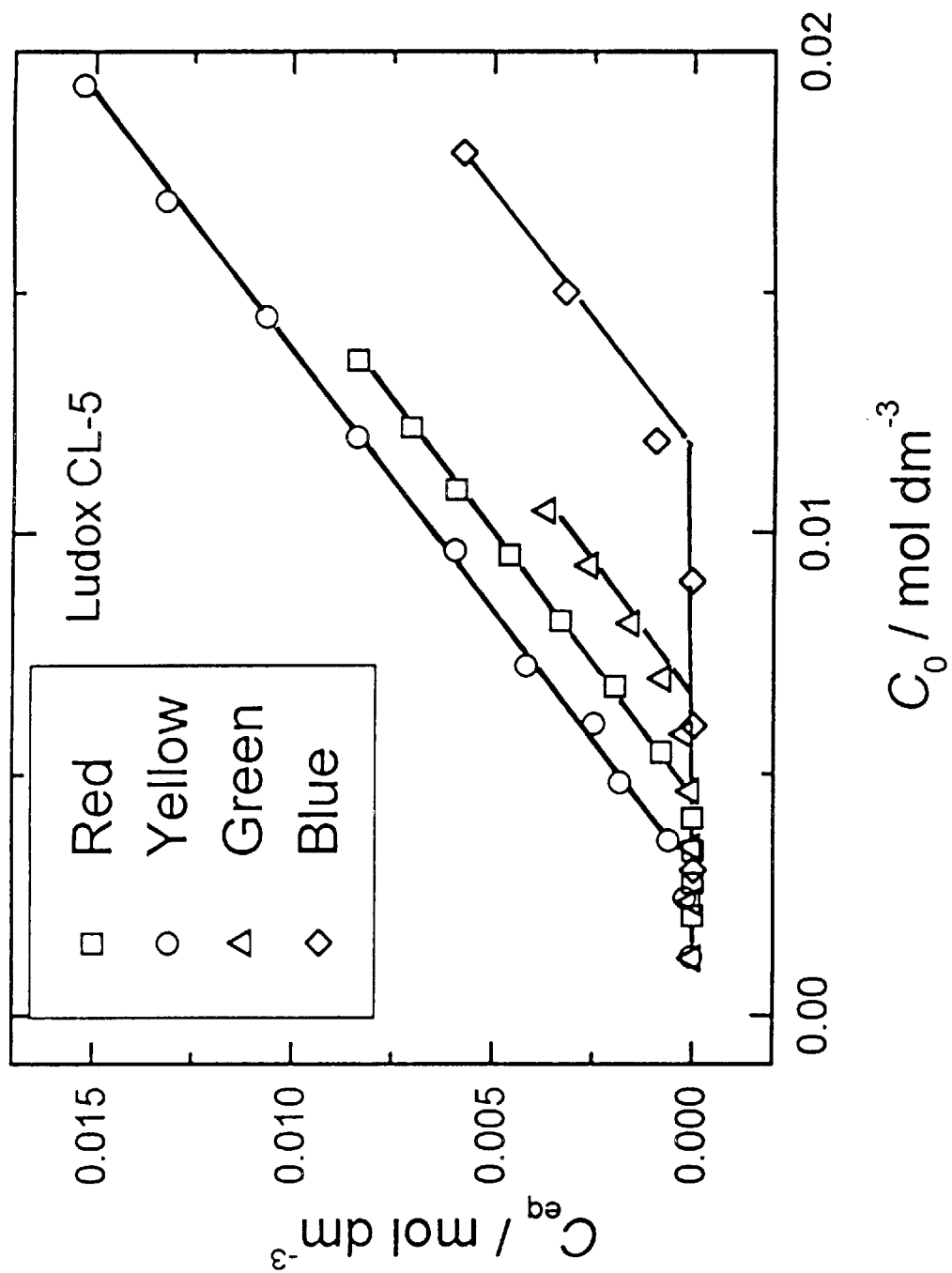
FIG. 7 discloses the equilibrium concentration of dyes in the supernatant solution as a function of the initial concentration for the systems shown in FIG. 6.

Effect of adsorbates: The adsorption isotherms for different dyes on Ludox CL-5 (3.5) show the same trend, except the plateau values vary (FIG. 6). The maximum adsorbed amounts obtained from these isotherms are listed in Table 3. Once again, in all cases the plot of $C_{eq}$ versus $C_o$ is characteristic of chemisorption (FIG. 7).

Figure 8:
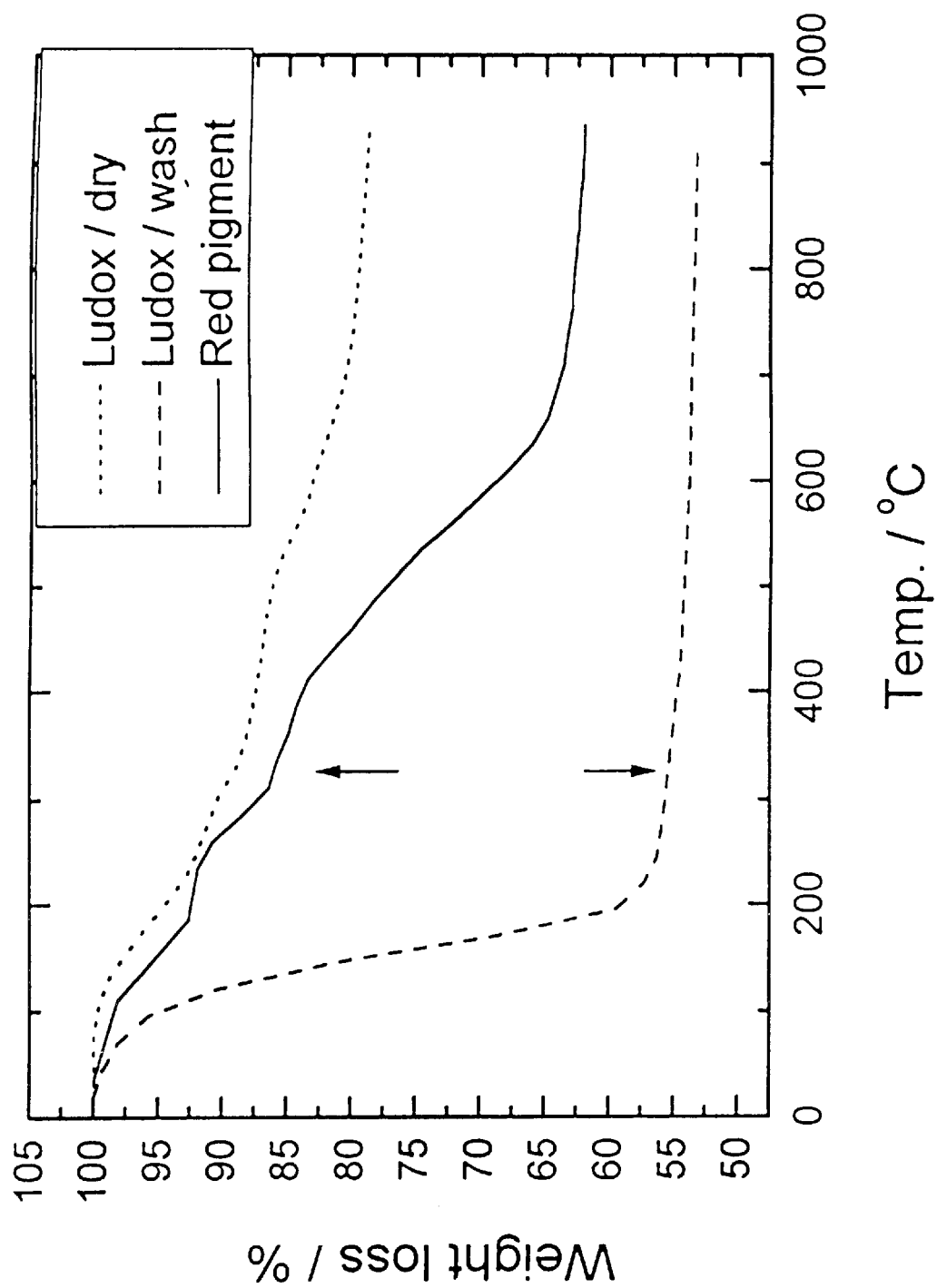
FIG. 8 shows the typical thermogravimetric data for Ludox CL-5 (3.5) before and after adsorbing D&C Red #6. The scanning rate used is 25.0° C./min. The weight decrease below 350° C. (arrow) is attributed to the loss of solvents. The "Ludox/dry" refers to the sample dried in vacuum and "Ludox/wash" was prepared by precipitating Ludox CL-5 (3.5) with potassium sulfate, then washed with water.

Thermogravimetric analysis (TGA) was used to determine the amount of adsorbed dye, and the result is illustrated in FIG. 8, using the red pigment. Since an organic stabilizer was present in Ludox CL, its weight content had to be determined in order to calculate the actual amount of the dye. For this purpose, two approaches were used to prepare Ludox CL samples for TGA experiments. In the first, the Ludox CL sample was dried under vacuum to retain the stabilizer in the solid, resulting in the total weight loss of 10% on heating from 350° C. to 900° C. In the second approach, particles were aggregated and settled on addition of $K_2SO_4$ and then washed three times with distilled water. In the latter case, the weight loss was ~3%, because part of the stabilizer was leached out on washing. Thus, the amount of the stabilizer in pigments prepared with the silica particles should be between these two extreme values. The weight loss on heating the red and yellow pigments, evaluated by the TGA, was found to be ~6% larger than calculated for the adsorbed amount of dye, the difference was caused by the stabilizer in Ludox. It should be pointed out that such experiments for blue and green pigments are less reliable, because of the uncertainty with respect to the purity of the used dyes. To make results of different pigments comparable, data are listed in moles of dyes per unit weight of adsorbent (Table 3). The chemisorption must be due to the interaction by sulfonate (—$SO_3$) and/or carboxylic (—COO) groups of dyes with ≡AlOH$^+$ sites on the surface of modified silica particles. The chemisorption mechanism is also supported by the fact that there is no observable leaching in water, ethanol, and the organic solvent (PMA) over a long experimentation times. The adsorption behavior of alumina coated silica used in this disclosure differs from that of acid pretreated alumina, (Jain et al., *Colloid Surf.*, 29, 373 (1988)) which shows a reversible uptake of dye, in strong dependence on the pH over the range of 1–9 and on the acid used to pretreat the adsorbent.

Figure 9:
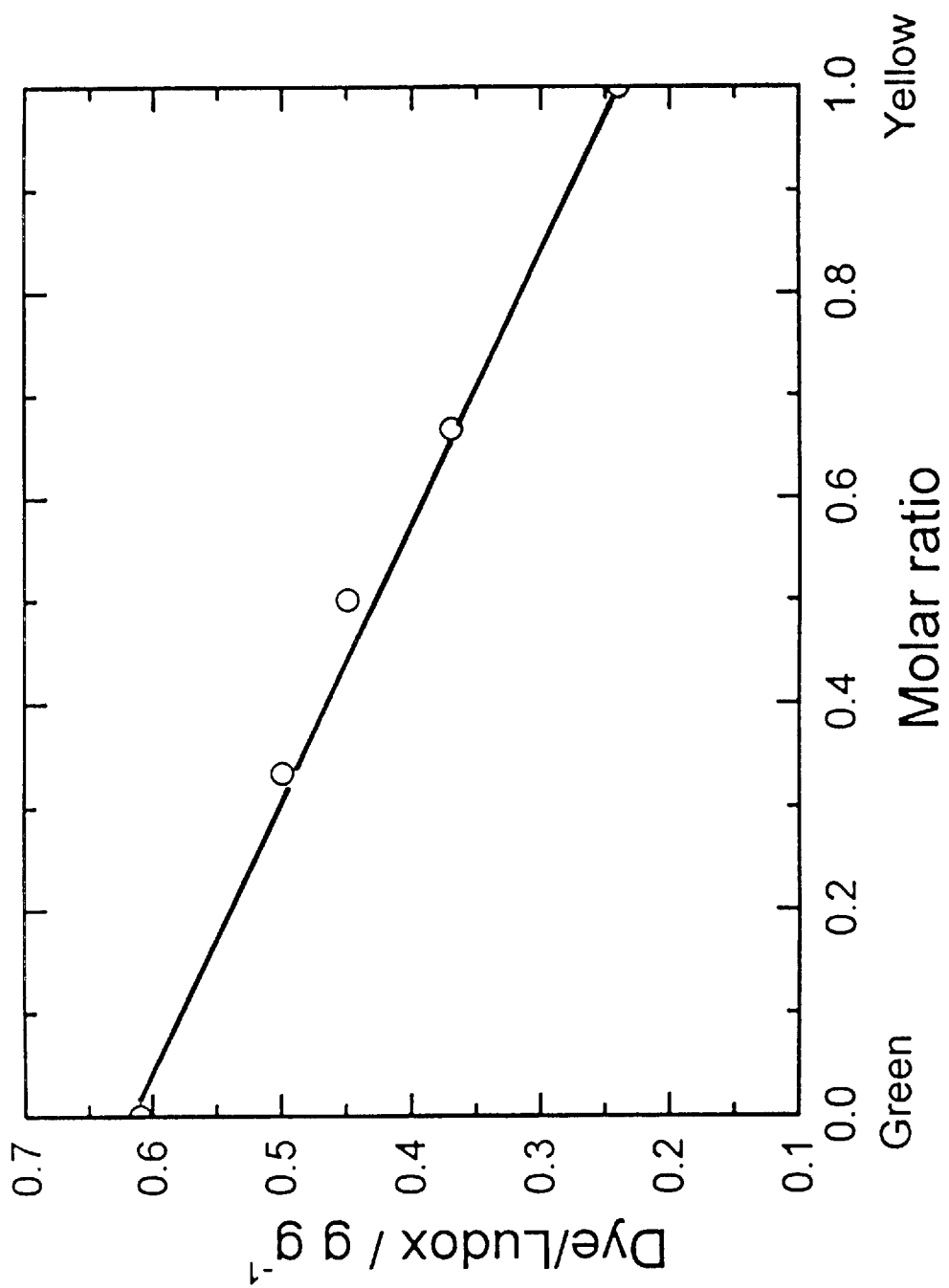
FIG. 9 shows the content of coadsorbed Guinea Green B and Acid Yellow #1 on Ludox CL-5 (3.3) as a function of the molar ratios of these dyes in the sorbing solution. The line represents the linear combination of green and yellow pigments of the same molar ratios.

Coadsorption of yellow and green dyes: To modify the color properties of the pigment, coadsorption of Acid Yellow #1 and Guinea Green B was accomplished on Ludox CL from solutions of different molar ratios of dyes. The total dye concentration used (~0.02 mol dm$^{-3}$) in these examples exceeds the saturation level. See FIG. 9, which shows the dye absorption vs. molar ratios of the two dyes.

Figure 2:
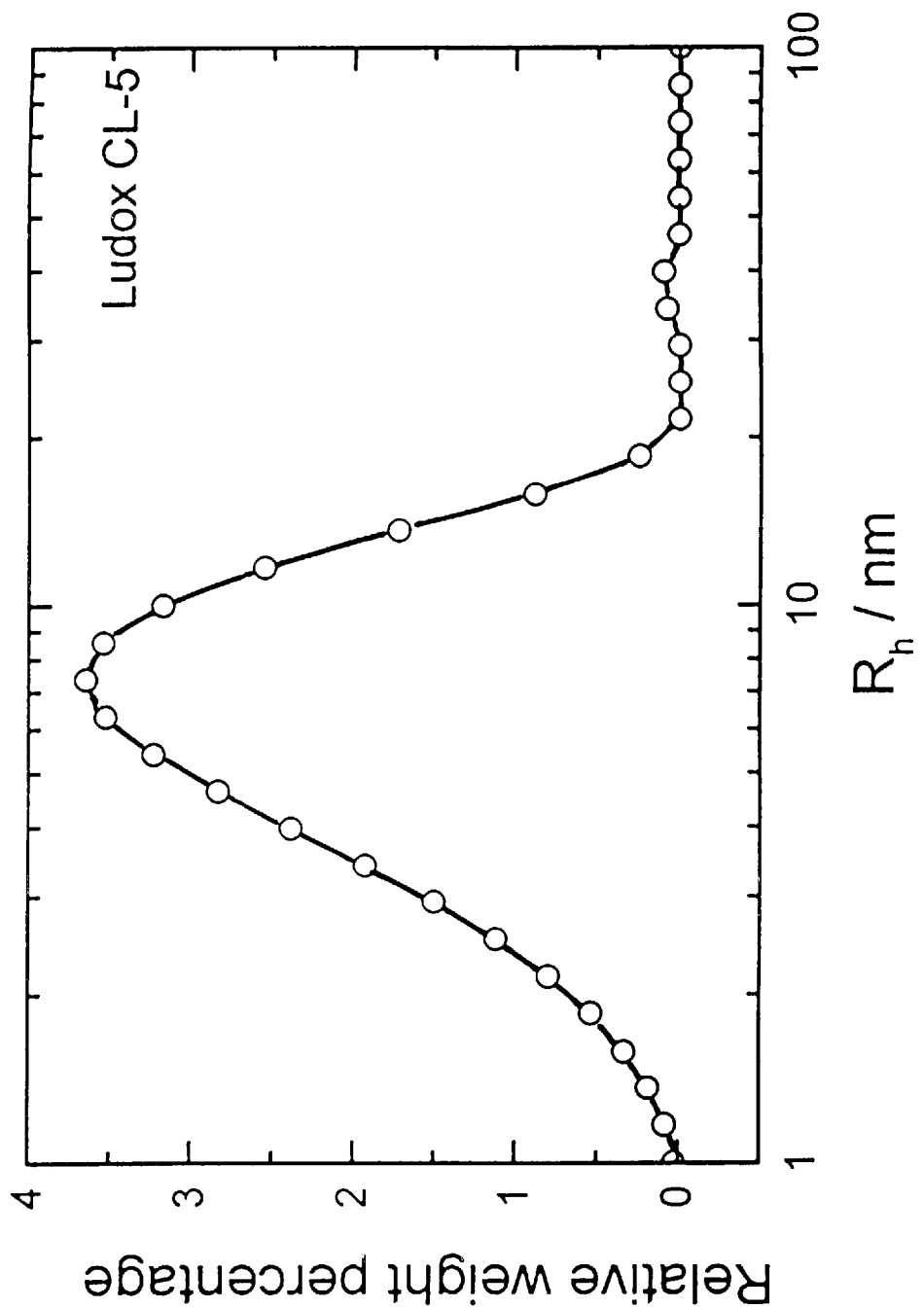
FIG. 2 is typical size distribution of the Ludox CL-5 (3.5) (Table 2) sample, determined by the dynamic light scattering and analyzing the correlation function with the CONTIN program.

Optical properties of nanosize pigments: By adsorbing anionic dyes on alumina modified silica particles as disclosed herein, well-defined pigments can be prepared, which is a more effective approach than grafting the dye to the surface of derivatized silica (See: Winnik et al., *Dyes and Pigments*, 14, 101 (1990); Hsu et al., *Ind. Eng. Chem. Res.*, 35, 2929 (1996)). In addition, the described procedure yields uniform and reproducible pigments in contrast to the traditional method based on reducing the particle size by grinding. Since the pigment retains essentially the same size and shape as the carrier particles (FIG. 2), the property of the pigments are controlled by selecting the core materials.

Figure 10:
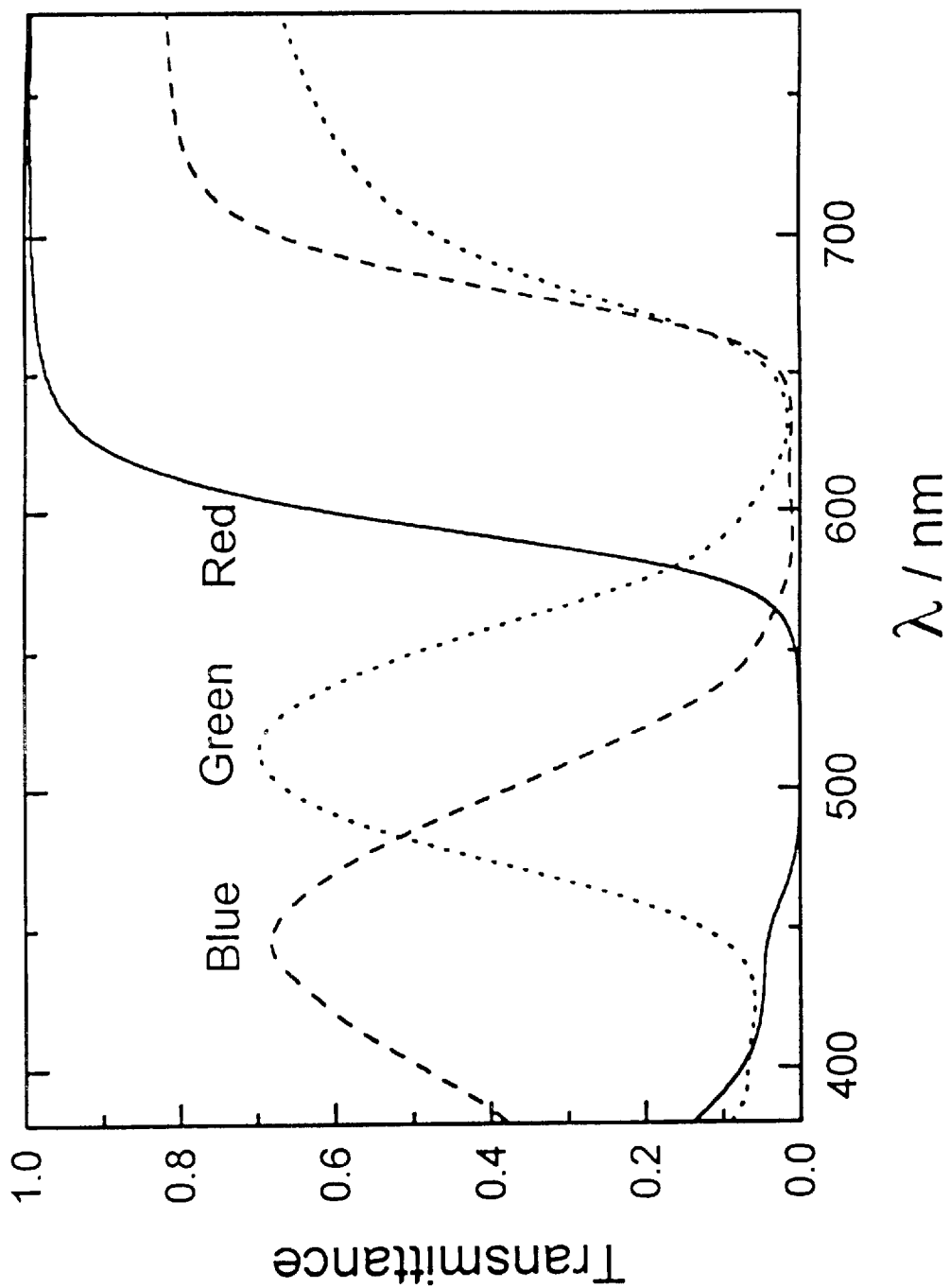
FIG. 10 shows the spectra of color thin films prepared by dispersing red (D&C Red #6), blue (Acid Blue 25), and green (Acid Yellow #1 and Guinea Green B mixture in a weight ratio of 2:1) pigments in acrylic copolymer at a solid loading of 60%. The film thickness is ~2, ~4, and ~2 μm for red, blue and green respectively.

FIG. 10 shows the transmittances of red, blue, and green thin films containing 60 wt. % solid pigments, prepared by adsorbing D&C red #6 and Acid Blue #25 on Ludox CL-5, respectively. The green pigment is obtained by mixing Acid Yellow #1 and Guinea Green B dyes at a controlled weight ratio of 2:1 using the same silica. The transmittance is very high, especial for the red thin film which reaches ~100% even with a film thickness of 8 $\mu$m. The results herein are unexpectedly better than anticipated.

Figure 11:
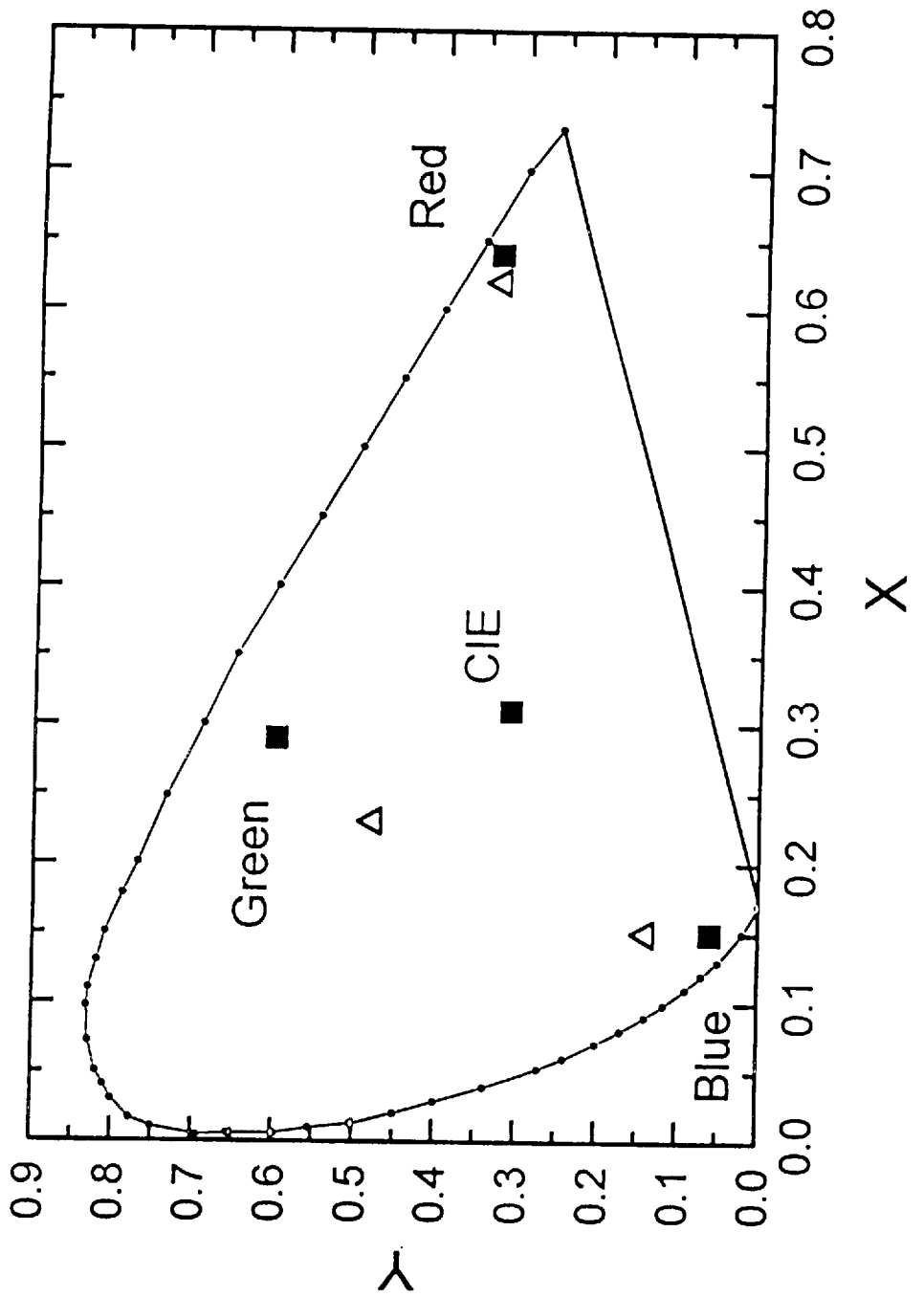
FIG. 11 illustrates the chromaticity diagram at the CIE system. The solid squares represent the reference chromaticity for red, green, blue and CIE light source respectively. The open triangles represent the chromaticity of thin color films the spectra of which are displayed in FIG. 10.

The chromaticity of thin color films was evaluated by means of commercial software based on the CIE (International Commission on Illumination) system and the results are displayed in FIG. 11. The chromaticities of the thin color films (a few $\mu$m thick), prepared by using pigments described in this work, are very close to the reference values (red: x=0.64, y=0.33; green: x=0.29, y=0.60; blue: x=0.15, y=0.06). The differences become smaller with increasing film thickness, or with higher solid content in the film of the same thickness. However, the mechanical properties of such film deteriorate after the solid loading exceeds an upper limit of ~70 wt. % which represents the preferred upper limit. Therefore, preferably 60 weight-percent pigment represents the practical upper limit.

EXAMPLES OF NON-IMAGING COLOR FILTER RESIST

Example 2

A polyimide-based color filter containing monodisperse colorant pigments prepared by the methods of this invention is defined as an example of a non-imaging non-photosensitized color filter resist. A film forming organic-based color filter is made of 15–30 weight percent poly[dimethylglutarimide] of weight-average molecular weight range [5,000–100,000] and a number-average molecular weight range [2,000–20,000] is dissolved in a solvent system using, either in all combinations, or separately, mixtures of propylene glycol methyl ether acetate, cyclopentanone, propylene glycol methyl ether, ethyl lactate, cyclohexanone, 3-ethoxyethylpropionate, and/or 3-methoxymethyl propionate. Monodisperse colorant pigments prepared via the methods of this invention [Red, Green, Blue, Cyan, Magenta, Yellow] are then dispersed in the polymeric solution (polymer resin binder) respective to the color required, either separately or in blends as needed to fine-tune color specifications, using dispersants known to the pigment and color filter industry, with agitation e.g. Polystep F-3(an Alkylphenol Ethoxyfate nonionic type, Stephan Co.), for a 24 hr. period. The total solids of monodisperse colorants used in this invention range from 30 to 85 weight-%, with the preferred embodiment in the 40–65 weight-% range. Following successful dispersion, the resulting colored dispersion is filtered through a series of coarse and fine filters, either absolute or depth, into a clean brown bottle, or a vessel appropriate for user application.

Example 3

A non-imaging color filter resist made as in Example 2, using a poly[amic acid—imide] polymer in place of poly[dimethylglutarimide], of weight-averaged molecular weight range [5,000–100,000] and number-averaged molecular weight range [2,000–20,000] is prepared. A preferred polymer for this example is in the molecular weight range [10,000–30,000] and is the condensation polymer of pyrromellitic dianhydride [PDMA] and oxydianiline [ODA], such as DuPont Kapton™ polymer.

Example 4

A non-imaging color filter resist made as in Example 2, using an epoxy-novolak polymer, of weight-averaged molecular weight range [3,000–20,000] and number-averaged molecular weight range [600–2,000] with a thermal acid generator (TAG) nitrobenzyl tosylate (TAG) to crosslink the polymer upon thermal cure is prepared. A preferred polymer for this example is 1,4-butanediol diglycidyl ether of phenol formaldehyde novolak, such as Dow Chemical DEN-431.

Example 5

A non-imaging color filter resist made as in Example 2, using the preferred embodiment of the invention, an acrylic terpolymer, and the specific modification using, as an incorporated monomer, an epoxy-acrylate, to give a tetra polymer is prepared. A thermal acid generator such as p-nitrobenzyl tosylate (TAG) is used in the color filter formulation to crosslink the polymer upon thermal cure, thereby hardening the film to prevent intermixing with the top-imaging photoresist layer. A preferred polymer for this example is the acrylic tetrapolymer of 5 mole-% methacrylic acid [MAA], 10 mole-% glycidyl methacrylate [GMA], 20 mole-% butyl acrylate [BA] and 65 mole-% methyl methacrylate [MMA].

Example 6

A non-imaging color filter resist, made as described in Example 5, but using the preferred acrylic polymer set forth herein is prepared. The non-crosslinking Color Filter material is primarily used for LASER Ablation Transfer Techmology [LATT] applications. The preferred acrylic polymer for this example is the acrylic tetrapolymer consisting of 5 mole-% methyacrylic acid [MAA], 15 mole-% hydroxyethylmethacrylate [HEMA], 10 mole-% butyl acrylate [BA] and 70 mole-% methyl methacrylate [MMA].

EXAMPLES OF COLOR FILTER IMAGING PROCESSES USING NON-IMAGING COLOR FILTER MATERIALS

Example 7

The non-imaging color filter material from Example 2 is used in conjunction with an imaging g-Line or i-Line sensitive positive or negative-tone photoresist, in the following manner: The color filter resist from Example 2 is coated onto glass, silicon, ITO on glass, or other substrate, using either a spin coating, or a reduced-volume dispense method, such as slot coating, to film thickness satisfying color chromaticity requirements for the application. The resist film is then thermally cured of excess solvent and, following further cure-hardening to form a solid polymer, is overcoated with an imaging photoresist.

The top photoresist layer is then imaged using methods well known in the art. Thereafter, the bottom color filter layer is etched through the already-patterned top-imaging resist, using an aqueous TMAH-based or metal hydroxide-based developer, of sufficient strength to remove the full thickness of color filter resist in a 1–5 minute time period. Following the color filter etching process, the top-layer resist is removed with an organic solvent, such as acetone, which does not attack the bottom-layer color filter resist.

This process is repeated serially until all color filter materials are patterned as needed for the application. For example, in the case of color filter mosaic fabrication for an Active matrix Liquid Crystal Display [AMLCD], this process is performed using the 3 primary color filter materials; red, green and blue. For other applications, such as Charge-Coupled Device [CCD] and CMOS imager chips, the use of the three primary red, green, and glue color filter materials, or the three secondary color filters, magenta, yellow and cyan, likewise processed, is used.

Example 8

The color filter materials described in Example 3 are processed in the same manner as shown in Example 7 above, but the film curing temperature is adjusted to convert the (polyamic acid-imide) to its mostly imidized form. This cure will provide the color filter film with sufficient chemical resistance to prevent intermixing with the top-imaging resist.

Example 9

The color filter materials from Example 4 are processed in a similar manner to those shown in Examples 7 and 8, except that the epoxy-novolac is cured at a temperature sufficient to activate the thermal acid generator p-Nitrobenzyl Tosylate, thereby initiating the crosslinking process. Following imaging of the top resist layer, the bottom crosslinked color filter layer is either wet-etched with strong aqueous base or dry-etched with an oxygen plasma through the patterned resist top-layer. Following bottom-layer imaging, the sacrificial imaged top-layer resist is removed, as described in Example 7.

EXAMPLES OF COLOR FILTER APPLICATIONS TO FLAT PANEL DISPLAY AND OTHER USES

Example 10
Active Matrix Liquid Crystal Displays [AMLCD]:

The imaging and non-imaging resists employing the monodisperse colorant systems described in this invention application may be used, for AMLCD applications. The AMLCD color filter mosaic is prepared using the process described in Example 7, to pattern 20–100 $\mu m^2$ square pixels. The primary advantages of the invention for AMLCD application are (1) the improved color contrast of the resulting color filter, and (2) the improved cleanliness of development, when compared to color filter resists using standard pigment-dispersions.

Example 11
Charged Coupled Device [CCD] or CMOS Imager Devices

The imaging photoresists employing the monodisperse colorant systems in this application may be used for CCD and CMOS Imager devices. These devices, fabricated as part of the microlithographic process on silicon, involve the same steps as described in Example 7, but for 1–20 $\mu m$ lithographic purposes. The primary advantage for these devices is the clean resist development in open-field and line-edge areas, which allows for better effective resolution than that afforded through use of standard pigment-dispersion based color filter resists.

Example 12
LASER Ablation Transfer Technology: [LATT]

The non-imaging color filter resists incorporating the monodisperse colorant materials, as described in Example 6 is useful in LATT. The LATT process using the non-imaging color filter resists physically transfers donor-plate coated material to an acceptor plate, via backside exposure of the donor plate to directed LASER energy. This process is repeated 3 times, or as many times as needed depending on the number of colors to be patterned.

Example 12
Ink Jet Printing Inks for use in color filters

An ink for ink jet printing for colored filter construction is prepared by mixing the pigments prepared in Examples 1 or 13 herein with the ink compositions set forth in U.S. Pat. No. 5,607,999 in Example 1 thereof wherein the colored pigments herein are used in place of the carbon black CB(MA-100). The entire contents of U.S. Pat. No. 5,607,999 is incorporated herein by reference hereto. The other Examples in this U.S. Pat. No. 5,607,999 may also be used.

The small uniform nature of the monodisperse particles allows clean transfer of fluid through the ink jet port with minimal chance of clogging.

FURTHER EXAMPLES OF PIGMENT SYNTHETIC PROCEDURE

Example 13

The synthesis of the colored pigment preferably comprises the drop-wise addition of 200.0 cm³ Ludox CL™ alumina coated colloidal silica (DuPont) to 4000.0 mL 0.02 molar (M) dye solution. The dye solution is constantly mixed during the addition of the Ludox CL™ alumina coated particles. The slurry is then mixed for 4 hours, after which the slurry is allowed to sit overnight. The next day the supernatant solution is discarded and the remaining slurry is centrifuged at 3300 relative centrifigul force times earth gravities (RCF×g) for 1 hour using a Centra centrifuge (IEC, model 4MP) with a model 224 rotor (IEC). The supernatant solution is then discarded. The pellet is washed with ~500 cm³ denatured ethyl alcohol (Mallinckrodt) and rolled on a ball mill overnight. The resulting slurry is then centrifuged as above. The supernatant solution is then discarded. The ethanol wash and subsequent centrifuge cycle is subsequently repeated, but the mixture is rolled for only 4 hours. Two more washes are performed as above, but this time with propylene glycol methyl ether acetate (PMA) with or without 5–10% dispersant. The second of the two PMA washes uses a high speed centrifuge rotor (IEC, model 854) at 14,400 RFC×g for 15.0 minutes instead of the model 224 rotor at 3300 RCF×g. Following the last wash, the supernatant solution should appear colorless. The remaining pellet is then analyzed for solid content by evaporating the excess solvent from a known quantity of paste in a tared aluminum pan at 100° C. for ~1 hour. The ratio of the remaining solid weight to the initial paste weight is used to calculate the amount of pigment than is in a given batch of paste.

Components Used to Prepare Colorant Particles
Cores:
Ludox CL™ alumina coat silica- core particles of 5, 7 and 12 nm were used. Both the 7 and 12 nm materials are colloidal suspensions of ~25% w/w solids, while the 5 nm colloidal suspension is 12.5% w/w solids
Dispersant:
Polystep F-3 (Stepan)
Polystep F-4 (Stepan)
Dyes:
Acid Blue 25 45% purity (Aldrich)
Guinea Green B 50% purity (Aldrich)
direct Green 26 (Crompton and Knowles)
D&C Red#6 95% purity (Sun Chemicals)
Intrajet Yellow I-TJ (Crompton and Knowles)
Naphthol Yellow S 70% purity (Aldrich)
Some of these dyes were chemically impure. The purity of these dyes was improved by recrystallization from water before use in the pigment synthesis.

Each dye listed is used separately in the method above to form the respective colored pigment, e.g., Acid Blue to prepare a blue colored pigment.
Red, Green and Blue Color Filter Resist Formulations Using the Colored Pigments of this Example:

The formulation consists of the addition of sufficient acrylic co-polymer such as the tetrapolymer consisting of 15 mole-% methacrylic acid [MAA], 8 mole-% hydroxyethyl methacrylate [HEMA], 16 mole-% butyl acrylate [BA] and 61 mole-% methyl methacrylate [MMA] (See U.S. Pat. No. 5,563,011) to give 70% pigment loading by weight of solids in a container of suitable size. A sufficient quantity of PMA (propylene glycol methylether acetate) is added to give a 22%–32% w/w solid concentration in the complete formulation. A small quantity of 1.0 cm radius cylinder zirconia mill beads are added to the mixture. The mixture is rolled on a ball mill for 1 hour.

To this 2.2% triazine-TFE (Shipley), 0.4% phenothiazine (Aldrich), and 5.3% hexamethoxymethyl melamine is added. These percentages are w/w of the complete formulation. This formulation is rolled on a ball mill overnight. Finally, the formulation is centrifuged at 10,000 RCF×g for 3 minutes to remove large aggregated particles. The supernatant solution is then removed to a clean storage container.

PREPARATION OF RED, GREEN AND BLUE COLOR FILTER RESISTS

Example 14

Color Filter Resist of Red Dyed Pigments

This method produces a 3.0 to 3.5 µm film coating with photospeed of 308 mJ/cm². After the curing process, the final color of the film is: x=0.63, y=0.33, Y=14.5 ($D_{65}$, 2° observer, 1931 CIE) with a thickness of ~3.2 µm and a transmittance of 95% at 650 nm. The method of processing is as follows:

Coating Method 1 (No Edge Bead Remover):

Approximately 2 grams of binder with red dyed pigments (D&C Red 6 red dyed) is placed on to a clean, untreated glass wafer. The wafer is then spun at 500 rpm for 45 seconds. The wafer is subsequently spun at 2000 rpm for 1 second to remove any edge bead.

Coating Method 2 (With Edge Bead Remover):

Approximately 2 grams of binder with red dyed pigments is placed on to a clean, untreated glass wafer. The wafer is then spun at 500 rpm for 30 seconds. A rinse with edge bead remover is then done with a spin speed of 300 rpm for 15 seconds followed by a 500 rpm dry cycle for 15 seconds.

Drying (Soft-Bake):

The wafer is place on a 90° C. hot plate for 60 seconds. Immediately following the soft-bake the wafer is placed on an aluminum heat sink to cool for at least 3 seconds.

Exposure:

The wafer is then flood exposed to 1 J/cm² of ultraviolet light from a high pressure mercury lamp filtered through an I-Line by-pass filter. When a multiple transmission mask is used, ~300 mJ/cm$_2$ is required to produce 7 µm adhesion squares.

Post-Bake:

The wafer is then placed on a 100° C. hot plate for 90 seconds. Immediately following the post-bake the wafer is placed on an aluminum heat sink to cool for at least 5 seconds.

Development:

The wafer is then immersed in a solution of 35% (v/v) 0.26N aqueous solution of tetramethylammonium hydroxide at 25° C. for 15±2 seconds. The wafer is immediately removed to deionized water and then rinsed under a moderate stream of deionized water for 20–30 seconds. The wafer is then gently dried with nitrogen.

Curing:

The coated wafer is placed in a 200° C. oven for 30 minutes.

Example 15 and 16

The same procedure of Example 14 was used except the dyes used are Guinea Green B and Acid Blue 25.

PIXEL COATING FORMULATIONS

Example 17

Green Pigment Coating Formulation

Materials: (1) 205.80 g. Guinea Green B dyed pigment
(2) 56.85 g. polymer
(3) 10.70 g. 2(2'-furylethylidene)-4,6-bis(trichloromethyl)-s-triazine
(4) 2.35 g. phenothiazine
(5) 26.8 g. hexamethoxymethylmelamine
(6) 190.79 g propylene glycol monomethylether acetate The polymer above comprises 15 mole-% methylacrylic acid (MMA), 8 mole-% hydroxymethylacrylate (HEMA), 16 mole-% butyl acrylate (BA) and 61 mole-% methylacrylate. The pigment is dyed alumina coated silica particles prepared as described herein and has about 7 nm average diameter.

In this example (all parts) all amounts are in grams.

Procedure:

1. Weigh pigment, polymers, and surf into a suitable sized container.
2. Roll mixture with mill beads for at least one hour.
3. Add remaining components.
4. Roll overnight to form the final coating formulation.

Example 18

Yellow Pixel Coating Formulations

Materials: (1) 190 Intrajet Yellow I-TJ dyed pigment.
(2) 57.87 polymer
(3) 9.67 2(2'-furylethylidene)-4,6-bis(trichloromethyl)-s-triazine
(4) 2.05 phenothiazine
(5) 24.0 hexamethoxymethylmelamine
(6) 153.93 propylene glycol monomethylether acetate The polymer is the same as in Example 17. The pigment is dyed alumina coated silica particles prepared as described herein and has about 7 nm average diameter. The formulation is prepared the same way as in Example 17 above.

Example 19

Red Pixel Coating Formulation

Materials: (1) 241.948 D&C Red #6 dyed pigment
(2) 56.25 polymer
(3) 10.948 2(2'-furylethylidene)-4,6-bis(trichloromethyl)-s-triazine
(4) 2.198 phenothiazine
(5) 26.25 hexamethoxymethylmelamine
(6) 90.42 propylene glycol monomethylether acetate The polymer is the same as in Example 17. The pigment is dyed alumina coated silica particles prepared as described herein and has about 7 nm average diameter. The formulation is prepared the same way as in Example 17 above.

Example 20

Pixel Coating Formulations

Materials: (1) 313.95 Acid Blue 25 dyed pigment
(2) 56.25 polymer
(3) 10.94 2(2'-furylethylidene)-4,6-bis(trichloromethyl)-s-triazine
(4) 2.198 phenothiazine
(5) 26.25 hexamethoxymethylmelamine
(6) 90.42 propylene glycol monomethylether acetate Pigment is dyed alumina coated silica particles prepared as described herein and has about 7 nm average diameter. The formulation is prepared the same way as in Example 17 above.

TABLE 1

Organic dyes used in this work

| Name | Formula |
|---|---|
| D & C Red 6 | CH₃-⟨benzene⟩-N=N-⟨naphthalene with HO, COONa, SO₃Na⟩ |
| Acid Yellow 1 | NaO₃S-⟨naphthalene with ONa, NO₂, NO₂⟩ |
| Acid Blue 25 | ⟨anthraquinone with NH₂, SO₃Na, NH-phenyl⟩ |
| Guinea Green B | (CH₂CH₃)(CH₂-C₆H₄-SO₃⁻)N⁺=⟨quinoid⟩-C(phenyl)-⟨C₆H₄⟩-N(CH₂CH₃)(CH₂-C₆H₄-SO₃Na) |

TABLE 2

Specifications of Ludox samples.

|   | Ludox | Specific surface area* m²/g | pH | Si/Al Molar ratio | Solid content wt. % | $R_h$*** nm | Mobility at pH = 4.0 μm-cm/s-V | Max. adsorption of D & C Red #6 g (dye)/g (Ludox) |
|---|---|---|---|---|---|---|---|---|
| A | CL-5(3.3) | 530 | 3.0 | 3.3 | ~12.5 | 6.5 | 2.7 | 0.30 |
| B | CL-5(3.5) | 530 | 3.0 | 3.5 | ~12.5 | 7.4 | 2.6 | 0.29 |
| C | CL-5(4.4) | 530 | 3.0 | 4.4 | ~12.5 | 8.7 | 2.4 | 0.18 |
| D | CL-7 | 380 | 4.0 | — | ~27 | 8.4 | 2.9 | 0.19 |
| E | CL-12 | 230 | 4.0 | 5.1** | ~33 | 10.0 | 2.8 | 0.12 |

*: determined by titration before coating with alumina.
**: calculated from composition provided with the sample.
***: Hydrodynamic radius, determined by light scattering.

TABLE 3

Data for adsorption of dyes on Ludox CL-5 at room temperature.

| Dye | D & C Red #6 | Acid Yellow #1 | Acid Blue 25 | Guinea Green B |
|---|---|---|---|---|
| Molecular weight, M | 430 | 358 | 416 | 691 |
| Dye/Ludox, $\Gamma_{max}$, g/g (adsorption) | 0.30 | 0.19 | 0.70 | 0.60 |
| Dye/Ludox, $\Gamma_{max}$, g/g (TGA) | 0.36 | 0.24 | 0.63 | 0.61 |
| $\Gamma_{max}$, $10^{-4}$ mole/g* | 7.0 | 5.3 | 13.7 | 8.0 |
| Area/nm²/molecule** | 1.1 | 1.5 | 0.6 | 1.0 |

*The $\Gamma_{max}$ used here is calcutated from the TGA results after correcting for the contribution from the Ludox CL sample (=$\Gamma_{max}$ (TGA) − 0.06).
**The specific surface area used is derived from the titration after correction for the alumina coating.

TABLE 4

Dispersants

| Product Name | Chemical Identity | Type | Manufacture |
|---|---|---|---|
| Polystep F-3 | Alkylphenol Ethoxylate | Nonionic | Stephan Co. |
| Polystep F-4 | Alkylphenol Ethoxylate | Nonionic | Stephan Co. |
| Ecco Dispersant PDQ | Ethoxylated Phenoxy Condensate | Nonionic | Eastman Chem. Co. |
| Dextrol OC-70 | Phosphate Ester | Nonionic | Dexter Chem. Corp. |
| Alkaterge T-IV | Oxazoline derivatives | Nonionic | Angus Chem. Co. |
| Lomar PWA | Sulfonated naphthalene condensate, ammonium salt | anionic | Henkel Corp. |
| Lomar PW | Sulfonated naphthalene condensate, sodium salt | anionic | Henkel Corp. |
| Lomar P-62 | Sulfonated naphthalene condensate | anionic | Henkel Corp. |
| Diwatex XP 9 | Sulfonated ligin | anionic | Lignotech USA Inc. |
| Monawet MO70 | Dioctyl sodium sulfosuccinate | anionic | Mona Industies Inc. |
| Alkaterge T | Oxazoline derivatives | Amphoteric | Angus Chem. Co. |
| Monazoline O | Oleyl Imidazoline | Amphoteric | Mona Industies Inc. |
| Monazoline T | Tall oil imidazoline | Amphoteric | Mona Industies Inc. |
| Aerosol C-61 | Ethoxylated Octadecylamine-Octadecylguanidine | Cationic | Cytec Industries Inc. |

We claim:

1. A colored pigment less than about 20 nm in average diameter comprising silica particles having an average diameter of less than about 20 nm and a surface area between 100 to 600 m²/g, said particles coated with a layer of alumina to provide a positive charged surface and an anionic colored dye layer adsorbed on said alumina.

2. The pigment of claim 1 in which the dye includes a (—$SO_3$) and/or (—COO) radical when in solution for reaction with the ≡AlOH⁺ of the alumina when in solution.

3. The pigment of claim 1 in which the dye has the structural formula:

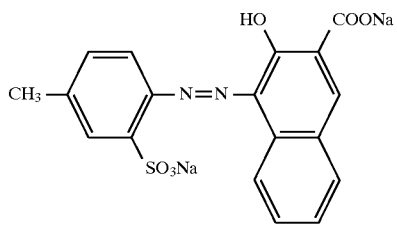

4. The pigment of claim 1 in which the dye has the structural formula:

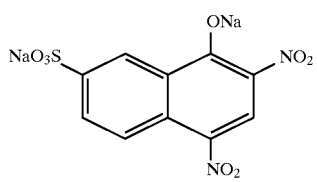

5. The pigment of claim 1 in which the dye has the structural formula:

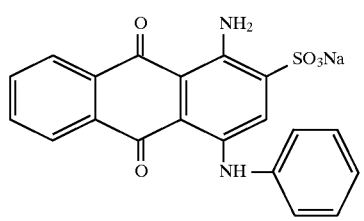

6. The pigment of claim 1 in which the dye has the structural formula:

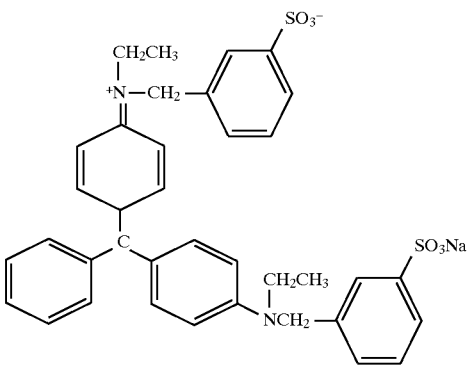

7. A color film comprising the pigment of claim 1, 2, 3, 4, 5 or 6 dispersed in a solid polymer to a loading of no more than 70% by weight.

8. A negative-tone imaging color filter photoresist comprising nanosized pigments of claim 1 in a polymer.

9. A non-imaging color filter photoresist comprising nanosized pigments of claim 1 in a binder.

10. The pigment of claim 1 or 2 in which the surface are is between 200 m²/g to 600 m²/g.

11. A color film or resist in which the pigment of claim 1 is dispersed in a polymer binder to a maximum loading of 70% and a dispersant, said dispersant for said pigments in an amount of 0.1 to 3 wt/% by total weight of the film or resist.

12. The colored pigment of claim 1 in which the diameter is about 4 nm to less than about 20 nm.

13. A color filter comprising a transparent substrate, colored pixels on said substrate containing colored pigments and a resin binder as a solid, said pixels comprising pigments having an average diameter less than about 20 nm and comprising silica having a sufficient coating of alumina to form an adsorbent, and colored anionic dye adsorbed on said alumina.

14. The color filter of claim 13 in which the dye has sulfonate and/or carboxylic groups bound to the surface of said alumina.

15. An LCD including the color filter of claim 13 or 14.

16. A colored pigment less than about 20 nm in average diameter comprising silica particles having a diameter less than about 20 nm said particles coated with a layer of alumina to provide a positively charged surface and an anionic colored dye layer absorbed on said alumina.

17. The pigment of claim 16 in which the dye includes a ($-SO_3$) and/or ($-COO$) radical when in solution for reaction with the $\equiv AlOH^+$ of the alumina when in solution.

18. A color film comprising the pigment of claim 16 or 17 dispersed in a plastic binder to a loading of no more than 70% by weight.

19. A negative-tone imaging color filter photoresist comprising nanosized pigments of claim 16 in a resin binder.

\* \* \* \* \*